(12) United States Patent
Fricker

(10) Patent No.: US 9,538,688 B2
(45) Date of Patent: Jan. 3, 2017

(54) BIMODAL COOLING IN MODULAR SERVER SYSTEM

(71) Applicant: Advanced Micro Devices, Inc., Sunnyvale, CA (US)

(72) Inventor: Jean-Philippe Fricker, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 93 days.

(21) Appl. No.: 14/657,316

(22) Filed: Mar. 13, 2015

(65) Prior Publication Data
US 2015/0334879 A1 Nov. 19, 2015

(51) Int. Cl.
| | | |
|---|---|---|
| *H05K 5/00* | (2006.01) | |
| *H05K 7/20* | (2006.01) | |
| *H05K 7/14* | (2006.01) | |

(52) U.S. Cl.
CPC ........ *H05K 7/20809* (2013.01); *H05K 7/1488* (2013.01); *H05K 7/20254* (2013.01); *H05K 7/20545* (2013.01); *H05K 7/20736* (2013.01)

(58) Field of Classification Search
CPC ........ H01L 23/427; H01L 23/467; G06F 1/20; G06F 2200/201; H05K 7/20254; H05K 7/205; Y02B 60/1275
See application file for complete search history.

(56) References Cited

U.S. PATENT DOCUMENTS

| | | | |
|---|---|---|---|
| 8,081,473 B2* | 12/2011 | Cipolla | ........... H01L 23/4093 165/104.33 |
| 8,140,719 B2 | 3/2012 | Lauterbach et al. | |
| 8,422,218 B2* | 4/2013 | Fried | ................. F28D 15/0266 361/679.47 |
| 8,955,347 B2* | 2/2015 | Campbell | .......... H05K 7/20136 165/104.33 |
| 2009/0161312 A1* | 6/2009 | Spearing | ............ H05K 7/20727 361/679.47 |

(Continued)

FOREIGN PATENT DOCUMENTS

WO 2007107208 9/2007

OTHER PUBLICATIONS

Rich Miller, "eBay Shifts to Water-Cooled Doors to Tame High-Density Loads", Data Center Knowledge, May 20, 2014, 3 pages.

(Continued)

*Primary Examiner* — Robert J Hoffberg
*Assistant Examiner* — Hung Dang

(57) ABSTRACT

A server system includes a plurality of stacked modular computing structures. Each modular computing structure includes a circuit board comprising a computing resource, an air-fluid heat exchange structure comprising a first set of pipe segments, and a cold plate structure attached to a second set of pipe segments of the modular computing structure. The first set of pipe segments of each modular computing structure interfaces with the first set of pipe segments of at least one adjacent modular computing structure to form a corresponding section of a first fluid circulation loop. The second set of pipe segments of each modular computing structure interfaces with the second set of pipe segments of at least one adjacent modular computing structure to form a corresponding section of a second fluid circulation loop.

20 Claims, 8 Drawing Sheets

(56) References Cited

U.S. PATENT DOCUMENTS

| | | | |
|---|---|---|---|
| 2009/0244830 A1* | 10/2009 | Wyatt | H05K 7/20809 361/679.47 |
| 2012/0176745 A1* | 7/2012 | Helberg | G06F 1/1632 361/679.47 |
| 2013/0342996 A1 | 12/2013 | Fricker | |
| 2014/0233175 A1* | 8/2014 | Demange | H05K 7/20772 361/679.47 |
| 2015/0131223 A1* | 5/2015 | Barina | G06F 1/20 361/679.47 |
| 2015/0160702 A1* | 6/2015 | Franz | H05K 7/20772 361/679.47 |

OTHER PUBLICATIONS

"ChilledDoor: Rack Cooling System", Product Brochure, Motivair Cooling Solutions, Apr. 1, 2014, 8 pages.

\* cited by examiner

BIMODAL COOLING IN MODULAR SERVER SYSTEM

BACKGROUND

Field of the Disclosure

The present disclosure relates generally to server systems and, more particularly, to cooling in server systems.

Description of the Related Art

Thermal management is a key criterion for effective data center operation. Conventional approaches rely primarily on forced air flow to evacuate heat from servers. However, server systems typically utilize a backplane structure that is oriented orthogonal to the circuit boards needing cooling, and thus impedes the flow of air over the circuit boards. To compensate, high-power fans may be used, but such devices substantially increase the energy consumption of the server system. In light of these deficiencies, some server systems implement water cooling, either in the form of water-cooled doors at the front or back of the server rack, or water cooling pipes run directly to the circuit boards in the server rack. The water-cooled doors, however, suffer from the same issue with air impedance through the backplane. Direct water-cooling also is problematic in that it introduces the risk of leaks on components highly sensitive to water.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
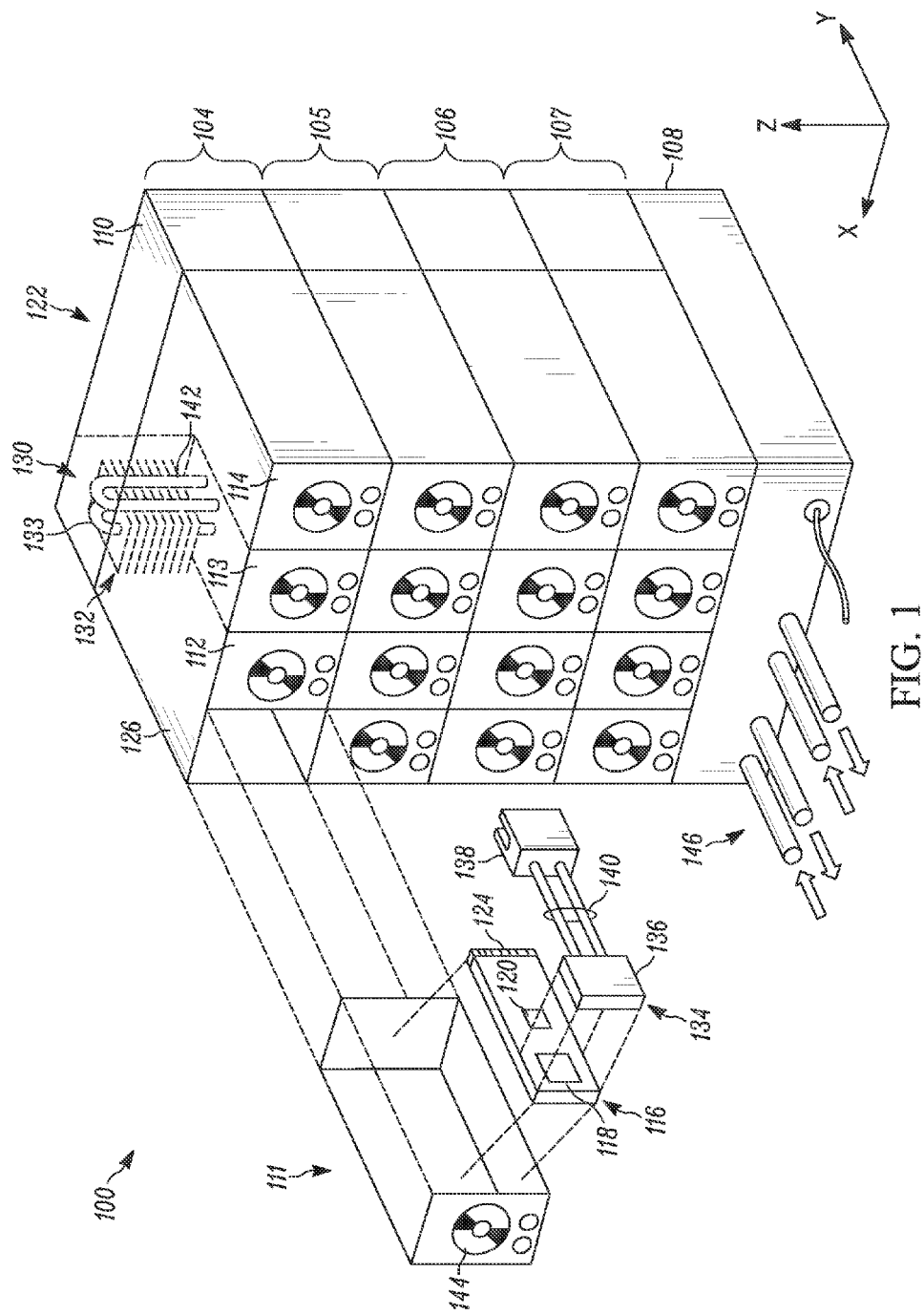
FIG. 1 is a perspective view diagram of a modular server system utilizing bimodal cooling in accordance with some embodiments.

Conventional cooling solutions for server systems typically rely on high-powered fans to overcome the air flow impedance caused by flat, monolithic backplanes that run perpendicular to the desired air flow, or rely on water piping that brings water into proximity of sensitive computing resources. FIGS. 1-9 illustrate example systems and techniques that employ a modular server architecture and a bimodal cooling system to provide efficient cooling with reduced risk of water damage to valuable computing resources. In at least one embodiment, a server system employs a modular architecture having an array of modular computing structures stacked in one or more columns and one or more rows (or tiers). Each modular computing structure includes a backplane module that interfaces with one or more compute modules. The backplane module has a ventilated back panel, as well as backplane interface boards (e.g., printed circuit boards (PCBs)) that are oriented orthogonal to the back panel. Each compute module includes one or more PCBs or other circuit boards that are likewise oriented orthogonal to the ventilated back panel when the computing node is engaged with a corresponding slot of the backplane module, such that the circuit board of the compute module interfaces with a corresponding backplane interface board in the same plane.

The modular server system further employs a bimodal cooling system that implements both an air-fluid heat exchange process (convection) using radiator structures and a direct contact heat exchange process using cold plate structures that contain phase change material (PCM) to efficiently disperse heat (conduction). Each backplane module implements at least one set of pipe segments, such that when a plurality of backplane modules are stacked together, each set of pipe segments forms a corresponding section of a fluid circulation loop. The backplane structure includes, for each compute module slot, an air-fluid exchange structure (e.g., a radiator structure) that is disposed around, or otherwise thermally coupled to, a set of pipe segments, and thus serves to transfer heat energy in the air flowing through the compute module to the first fluid circulation loop.

Each compute module includes a cold plate structure that includes a cold plate that is placed in contact with, or otherwise adjacent to, one or more computing resources (e.g., a processor) of the circuit board of the compute module, a thermal connector that engages with a set of pipe segments of the corresponding slot in the backplane module, and a set of circulation pipes to circulate a phase change material between the cold plate and the thermal connector. In some embodiments, the air-fluid exchange structure and the cold plate structure utilize separate fluid circulation loops, while in other embodiments, they share at least one fluid circulation loop, whereby the thermal connector of the cold plate structure thermally couples to the same pipe segments used by the air-fluid exchange structure on this shared fluid circulation loop. In this configuration, heat energy from the computing resource is imparted to the PCM in the plate section, and once sufficient heat has been imparted, the PCM changes phases (e.g., from a liquid to a gas or from a solid to a liquid), and the heated material circulates to the thermal connector, whereupon the heat energy is conducted into the corresponding set of fluid circulation pipes via the thermal connector.

With the backplane interface boards oriented parallel to the cooling airflow in accordance with the modular structure described herein, the airflow remains substantially unimpeded and thus efficient air cooling may be achieved without high-powered cooling fans. Moreover, through the use of PCM in the cold plate structure, direct contact cooling may be achieved without risking water leaks around sensitive computing resources. Further, the modular structure permits rapid fabrication of server racks of arbitrary sizes with fluid circulation loops, air-fluid heat exchange structures, and direct heat exchange structures that are segmented and scale automatically with the build-up of the server rack.

FIG. 1 illustrates a modular server system 100 utilizing bimodal cooling in accordance with at least one embodiment. In the depicted example, the modular server system 100 employs a plurality of modular compute structures, such as the four illustrated modular compute structures 104, 105, 106, and 107, stacked on a base 108. Although the modular compute structures 104-107 are illustrates as being stacked in a vertical orientation, in other embodiments the modular compute structures may be stacked in a horizontal orientation. Each modular compute structure comprises one or more compute modules and a backplane module having one or more slots to receive the corresponding one or more compute modules. To illustrate, the modular compute structure 104 includes a backplane module 110 to couple with four compute modules 111, 112, 113, and 114.

As illustrated by the depicted exploded view of compute module 111, each compute module includes one or more circuit boards 116 implementing one or more compute resources, such as a processor 118 (e.g., a central processing unit (CPU) or graphics processing unit (GPU)), a network interface chip 120, memory, a hard drive or other mass storage device, and the like. In at least one embodiment, the one or more circuit boards 116 of the compute module are oriented in the housing of the compute module so as to be orthogonal to the back surface 122 of the server system 100 (that is, parallel to the y-z plane of FIG. 1) when the compute module is coupled with the corresponding backplane module. As illustrated in greater detail below with reference to FIGS. 2 and 3, each backplane module comprises a plurality of slots, each slot having an interface board to electrically couple to a corresponding interface connector 124 of at least one circuit board 116 of a corresponding compute module inserted into the slot. The interface boards, like the circuit boards of the compute nodes, are oriented so as to run orthogonal to the back surface 122 of the modular server system 100. Moreover, each backplane module includes inter-backplane interface connectors along the top surface and the bottom surface, whereby these interface connectors are configured to electrically couple to corresponding interface connectors of backplane modules stacked above or below the backplane module. The interface boards within the backplanes and the inter-backplane interface connectors are connected so that the stack of backplane modules together forms a backplane network or mesh for the compute modules coupled to the backplane modules. Additional details on the general modular configuration of such a server system may be found in U.S. Pat. No. 8,140,719 (entitled "Dis-Aggregated and Distributed Data-Center Architecture Using a Direct Interconnect Fabric") and co-pending U.S. patent application Ser. No. 13/530,958, entitled "Electronic Interconnect Method and Apparatus" and filed on Jun. 22, 2012, the entireties of which are incorporated by reference herein.

In at least one embodiment, the modular server system 100 is fabricated by stacking one or more backplane modules together and then coupling compute modules with the corresponding slots of the backplane modules. The server system 100 may employ various structures to facilitate the stacking of the backplane modules, the insertion of the compute modules, and the stabilization of the resulting structure. For example, as shown, the server system 100 may employ a rack cabinet with a slotted structure 126 having a matrix of "pigeon holes", each to receive a corresponding compute module and aligned with a corresponding slot on a backplane module to facilitate coupling between the circuit board 116 of the compute module and the interface board of the backplane module. This modular arrangement, along with the network connectivity afforded by the interconnects of the backplane modules, allows for the size of the modular server system 100 (that is, the number of compute modules) to be customized based on various objectives.

While operational, the computing resources and other electronic components of the modular server system 100 generate heat, which should be removed from the system so as to prevent damage due to excessive heat, as well as to operate the computing resources at the temperatures most suited to efficient performance. To provide this cooling in an effective manner, the modular server system 100 employs a bimodal cooling system 130 to effectively evacuate heat using two complementary processes, or modes: an air-fluid heat exchange process and a direct heat exchange process utilizing the latent heat capacity of a PCM. For the air-fluid heat exchange process, radiator structures or other air-fluid heat exchange structures are employed in each backplane module, and sets of these air-fluid heat exchange structures are interconnected via one or more fluid circulation loops. For the direct heat exchange process, cold plate structures containing PCM are employed in each compute module, and sets of these cold plate structures likewise are interconnected via one or more fluid circulation loops. The fluid circulation loops may circulate any of a variety of fluids useful for evacuating heat, such as water, organic or inorganic oils, propylene glycol, and the like. For ease of description, reference to water-based fluid cooling generally is referenced below. As such, "water" and "fluid" are used interchangeably unless otherwise noted.

As illustrated in greater detail below, in some embodiments the modular architecture of the modular server system 100 is leveraged to also provide a modular architecture for both the air-fluid heat exchange structures and the cold plate structures. In some embodiments, each slot of the backplane (or each subset of one or more slots) is provided with a corresponding air-fluid heat exchange structure. For example, as illustrated in FIG. 1, the backplane module 110 includes an air-fluid heat exchange structure 132 for the slot that is to receive the illustrate compute module 111. In other embodiments, the backplane module uses a single air-fluid heat exchange structure shared by all of the slots. Each air-fluid heat exchange structure comprises a radiator structure attached to or otherwise thermally coupled to a set of pipe segments that extend between the top surface and the bottom surface ("top" and "bottom" being relative to the view orientation presented in FIG. 1) of the backplane module. The ends of the pipe segments have coupling mechanisms (such as O-rings) that permit the pipe segments of one backplane module to couple to the corresponding pipe segments of another backplane module, directly or through a pipe coupler, such that the pipe segments of a stack of backplane modules together form one or more fluid circulation loops though the modular server system 100. That is, each pipe segment of a backplane module forms a corresponding section of a fluid circulation loop when mated with one or more other backplane modules. Thus, in this embodiment, the air-fluid heat exchange structures in a given column are connected together by at least one fluid circulation loop 133. In some embodiments, a fluid circulation loop is completed at the top backplane module by connecting the outlet of the outflow pipe segment of the top backplane module with the inlet of its corresponding inflow pipe segment via a U-pipe segment. In other embodiments, the fluid circulation loop extends beyond the modular server system 100 (e.g., to another server system or to an external supplemental cooling system), in which case the outflow pipe segment of the top backplane module is connected to the inflow pipe inlet of the external system, and the outflow pipe outlet of the external system is connected to the inflow pipe segment of the top backplane module.

As noted above, the bimodal cooling system 130 also makes use of a direct heat exchange process to evacuate heat from the modular server system 100. Accordingly, in at least on embodiment, each compute module employs a cold plate structure that directly transfers heat from one or more computing resources on the circuit board 116 of the compute module to one or more fluid circulation loops 142 formed in the stack of backplane modules. As with the fluid circulation loops 133 for the air-fluid heat exchange structures, in at least one embodiment the fluid circulation loops 142 for the cold plate structures are formed using the same modular approach whereby each backplane module implements a corresponding set of pipe segments that, when multiple backplane modules are stacked together, couple with the corresponding pipe segments of the backplane modules above and/or below so as to together form a fluid circulation loop 142 within the backplane module stack. In this way, a fluid circulation loop 142 is formed for each column of slots in the backplane module stack, and thus permitting a column of compute modules to share the same fluid circulation loop.

To illustrate, as depicted by the exploded view of the compute module 111, the compute module 111 includes a cold plate structure 134 oriented parallel with the circuit board 116 and comprising a cold plate 136 connected to a thermal connector 138 via circulation piping 140. The cold plate 136 is in direct contact with, or in close proximity to, one or more computing resources, such as the processor 118. The thermal connector 138 is thermally coupled to a fluid circulation loop 142 formed in the backplane module stack for the first column of slots. As illustrated in FIG. 1 and as illustrated in greater detail below with reference to FIG. 5, the pipe segments in the backplane modules forming the fluid circulation loop 142 can include flattened sections and the thermal connector 138 may have a "pronged" or forked configuration so as to grasp the flattened sections of the pipe segments. In addition to, or instead of prongs, the thermal connector 138 may make use of louvers for improved thermal/electrical conductivity. The cold plate structure 134 contains a phase change material selected to undergo a phase change from a liquid to a gas (or a solid to a liquid) at a specified temperature (selected as, for example, falling within an intended operational temperature range of the computing resource in contact with the cold plate 136). Examples of PCM include, for example, organic paraffins, metal eutectics, salt hydrates, water, or combinations thereof. The resulting liquid circulates to the thermal connector 138, whereupon the transferred heat embodied in the liquid is transferred to the fluid circulation loop 142 and the water or other fluid circulating therein. Because of the density differences between the solid phase and the liquid phase of many PCMs, the circulation piping 140 may be arranged in a vertical orientation so as to enable passive circulation. However, in some embodiments, a variable speed circulator (see, e.g., circulator 622, FIG. 6) may be used to provide supplemental circulation of the PCM.

As described below, the back surface of the backplane modules 104-107 are ventilated so as to permit significant airflow. The orientation of the circuit boards 116 and the cold plate structures 134 of the compute modules orthogonal to this back surface results in a substantially unimpeded airflow path through each compute module from front to back (that is, along the y-axis of FIG. 1). As a result of this reduced air flow impedance, each compute module may implement one or more low-power fans 144 to move air over its circuit board 116 and cold plate structure 134, over the corresponding air-fluid heat exchange structure 132 in the backplane module and out the ventilated back of the backplane module. Although an embodiment wherein a fan 144 is positioned at the front of the compute module so as to push air through the corresponding pathway is depicted, in other embodiments the fan 144 may be positioned at the back of the compute module, or within the backplane module so as to pull air through the corresponding pathway, or a combination of forward-positioned and rear-positioned fans 144 may be implemented.

The base 108 serves as the mechanical foundation for the stack of modular compute structures 104-107. The base 108 may be a structure residing at least partially above a floor on which the modular server system 100 resides, the base 108 may be implemented as an area underneath the section of a raised floor on which the modular server system 100, or a combination of above-floor structure and below-floor space. In at least one embodiment, the base 108 houses piping (e.g., piping 146), manifolds, valves, pumps, rack-specific fluid reservoirs, and assorted equipment for the fluid circulation loops, as well as for cabling and other equipment for the electronic components of the rack. Example techniques for fluid circulation control using a data center's environmental control systems using this equipment are described below with reference to FIGS. 6-8. Moreover, as described below with reference to FIG. 9, as the piping of the fluid circulation loops may be composed of copper, aluminum, or other conductive materials, the base 108 may house a power supply unit that receives power from a data center power distribution network and provides at least one supply voltage to the backplane modules and compute modules via the conductive piping of the fluid circulation loops.

Figure 2:
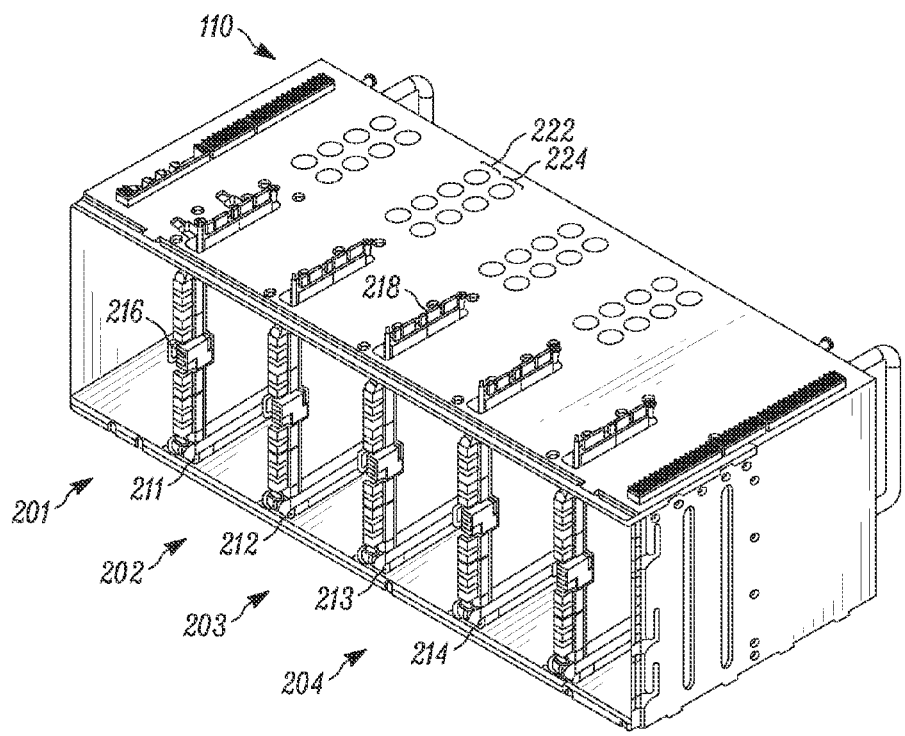
FIG. 2 is a front perspective view diagram of a backplane module of the modular server system of FIG. 1 in accordance with some embodiments.
Figure 3:
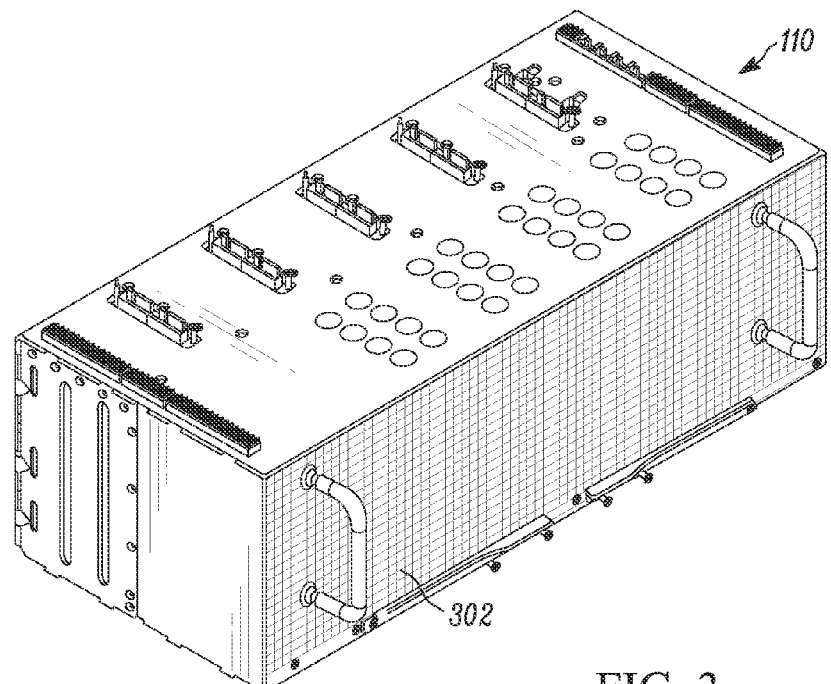
FIG. 3 is a back perspective view diagram of the backplane module of FIG. 2 in accordance with some embodiments.

FIGS. 2 and 3 illustrate perspective views of the front and back, respectively, of a backplane module, such as backplane module 110, of the modular server system 100 of FIG. 1 in accordance with some embodiments. As illustrated by FIG. 2, the backplane module 110 has a plurality of slots, such as slots 201, 202, 203, and 204, with each slot to receive a corresponding compute module. Each slot includes an interface board, such as interface boards 211, 212, 213, and 214, that includes an interface connector 216 to electrically and mechanically couple with the interface connector 124 of the circuit board 116 of the corresponding compute module. Each interface board includes a top interface connector 218 and a bottom interface connector (not shown), whereby the top interface connector 218 is to electrically and mechanically couple with the bottom interface connector of an interface board in the same slot position of a backplane module stacked on top of the backplane module 110 (in the event there is one so stacked) and the bottom interface connector is to electrically and mechanically couple with the top interface connector 218 of an interface board in the same slot position of a backplane module upon which the backplane module 110 is stacked (if there is one below). The interface connectors of the interface board may implement any of a variety of standardized interconnects, such as PCIe, any of a variety of proprietary interconnects, or a combination thereof.

Further, as illustrated in FIGS. 2 and 3, the backplane module 110 implements one or more sets of pipe segments used to form corresponding sections of one or more fluid circulation loops when backplane modules 110 are stacked.

In the depicted embodiment, each slot of the backplane module 110 includes a separate air-fluid heat exchange structure, and thus each slot has a set of pipe segments (e.g., set 222 of pipe segments for slot 201) that form a section of one or more fluid circulation loops for the column of air-fluid heat exchange structures. Further, in the depicted embodiment, each slot accommodates a compute module with a separate cold plate structure 134, and thus the backplane module 110 includes another set of pipe segments (e.g., set 224 of pipe segments for slot 201) that form a section of one or more fluid circulation loops for interfacing with the cold plate structures 134 in the corresponding column. For the embodiment of FIG. 1, each of the sets includes four pipe segments, thereby enabling the formation of two fluid circulation loops for each column of air-fluid heat exchange structures and two fluid circulation loops for each column of cold plate structures 134. As illustrated by FIG. 3, the back surface 302 of the backplane module 110 is ventilated so as to permit relatively unimpeded airflow over the interface boards and out the back of the backplane module 110. To illustrate, the back surface 302 may be formed using a wire mesh, perforated, or louvered panel.

Figure 4:
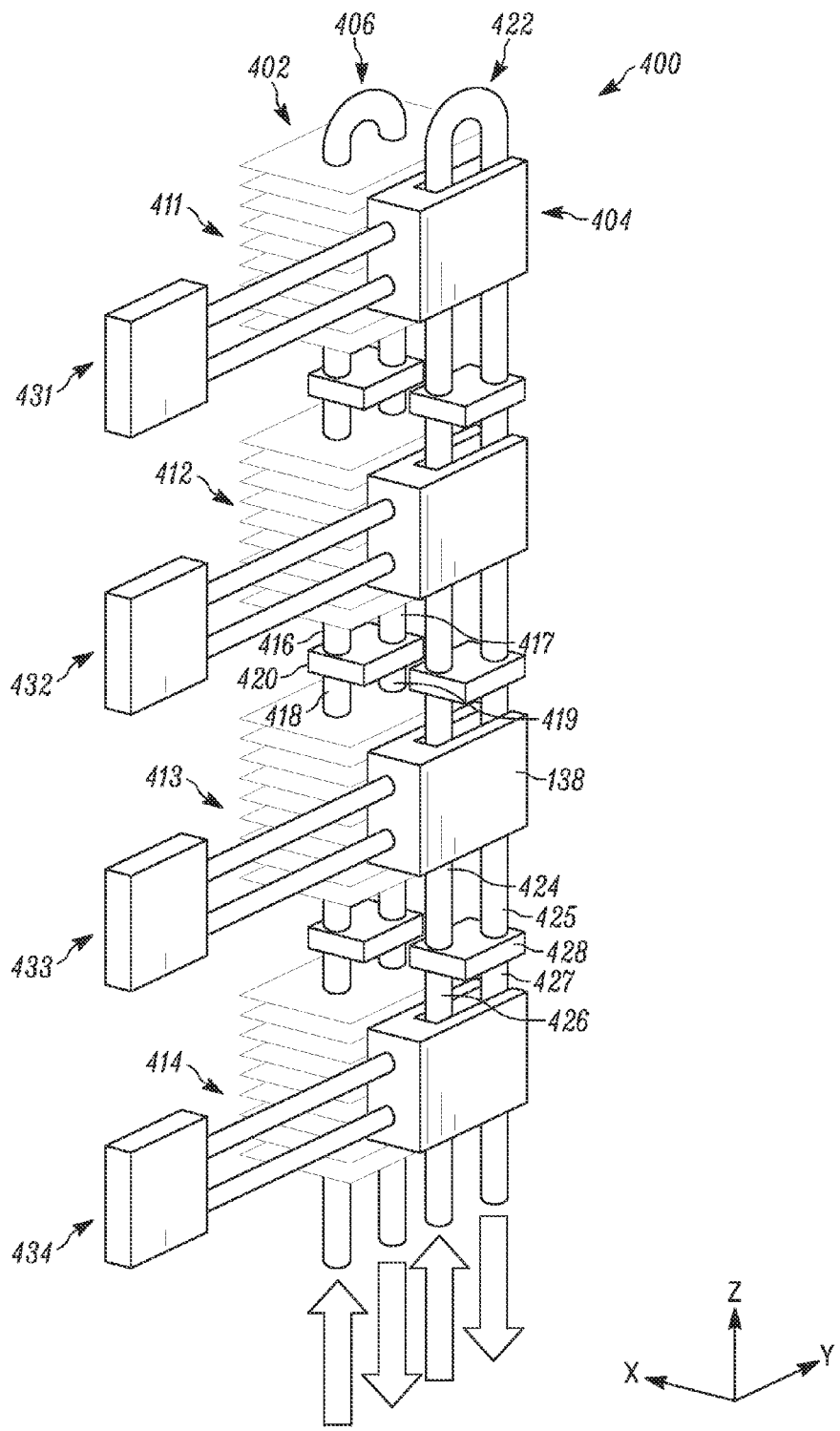
FIG. 4 is a perspective view of a subassembly of the bimodal cooling system for a column of the modular server system of FIG. 1 in accordance with some embodiments.

FIG. 4 illustrates a perspective view of a bimodal cooling subassembly 400 of the bimodal cooling system 130 of the modular server system 100 of FIG. 1 in accordance with at least one embodiment. The bimodal cooling subassembly 400 illustrates the assembled components of the bimodal cooling system 130 within a single column of the modular server system 100 and with the non-cooling-related components of the system 100 omitted from the depicted view. As depicted, the bimodal cooling subassembly 400 includes an air-fluid heat exchange subassembly 402 and a direct heat exchange subassembly 404 for a column of four slots, one each from the same slot position in the four modular compute structures 104-107 stacked in the manner described above.

The air-fluid heat exchange subassembly 402 includes a fluid circulation loop 406 (one embodiment of fluid circulation loop 133 of FIG. 1) formed from the stacking of four air-fluid heat exchange structures 411, 412, 413, and 414 (embodiments of the air-fluid heat exchange structure 132 of FIG. 1). Each air-fluid heat exchange structure includes a corresponding set of pipe segments of the fluid circulation loop 406 and pipe couplers to align and couple the set of pipe segments of each air-fluid heat exchange structure with pipe segments of the air-fluid heat exchange structures above and below it. To illustrate, the air-fluid heat exchange structure 412 may include pipe segments 416 and 417 coupled to pipe segments 418 and 419, respectively of the air-fluid heat exchange structure 413 via a pipe coupler 420 disposed between the two sets of pipe segments. The pipe coupler 420 may comprise, for example, a block with conduits formed therein to receive the corresponding ends of the pipe segments and one or more sealing mechanisms to maintain a fluid-tight seal. The block may be composed of a metal or metal alloy, such as copper or aluminum, plastic, rubber, and the like, or a combination of materials. The sealing mechanisms may comprise, for example, O-rings, or in an implementation whereby a continuous conductive connection is needed for the conduction of a current (as described below), the sealing mechanisms may comprise, for example, circular louvers composed of metal or other conductive materials. To illustrate, the pipe coupler 420 may incorporate the louvered arrangement as taught by, for example, PCT Published Application WO2007107208A1, the entirety of which is incorporated by reference herein. Each backplane module may comprise a pipe coupler at the top of the pipe segments to receive the bottom pipe segment ends from the backplane module above it or a pipe coupler at the bottom of the pipe segments to receive the top pipe segment ends from the backplane module below it. Alternatively, as shown below in FIG. 5, each backplane may comprise both a top pipe coupler and a bottom pipe coupler, wherein the top pipe coupler is configured to mate to the bottom pipe coupler of the backplane module above it, and the bottom pipe coupler is configured to mate to the top pipe coupler of the backplane module below it.

The direct heat exchange subassembly 404 includes a fluid circulation loop 422 (one embodiment of the fluid circulation loop 142 of FIG. 1) formed from the stacking of the four backplane modules such that a set of pipe segments of each backplane module mates with the corresponding sets of pipe segments of the adjacent backplane modules to form a continuous pipe conduit. As with the air-fluid heat exchange subassembly 402, each backplane module can implement pipe couplers to couple the pipe segments of one backplane module with the pipe segments of the backplane modules above and below it. To illustrate, the pipe segments 424 and 425 of one backplane module may be coupled to the pipe segments 426 and 427, respectively, of the backplane module below it via a pipe coupler 428. The direct heat exchange subassembly 402 further includes cold plate structures 431, 432, 433, and 434 (corresponding to the cold plate structure 134 of FIG. 1) of the four compute modules inserted into the corresponding slots of the depicted column. The thermal connector 138 of each cold plate structure engages with the corresponding pipe segments of the fluid circulation loop 422 so as to enable transfer of heat energy from the cold plate structure to the fluid circulation loop 422. To illustrate, as shown in FIG. 4, the thermal connector 138 of the cold plate structure 433 comprises a two prong structure that "pinches" the pipe segments 424 and 425 when the compute module having the cold plate structure 433 is inserted into its slot in the corresponding backplane module.

In at least one embodiment, the pipe segments in the pipe segments in the backplane module used for the fluid circulation loop 422 of the direct heat exchange subassembly 404 are positioned in proximity to the corresponding air-fluid heat exchange structure of the backplane module so that when the thermal connector—is engaged with the fluid circulation loop 422, a surface of the thermal connector 138 is placed into contact with or otherwise in proximity to the radiator structure so as to permit the radiator structure to absorb some of the heat energy from the thermal connector 138. Further, the proximity of the thermal connector 138 to the radiator structure allows the thermal connector 138 to also take advantage of some of the air flow directed to the radiator structure to further cool the PCM circulated within the cold plate structure.

Figure 5:
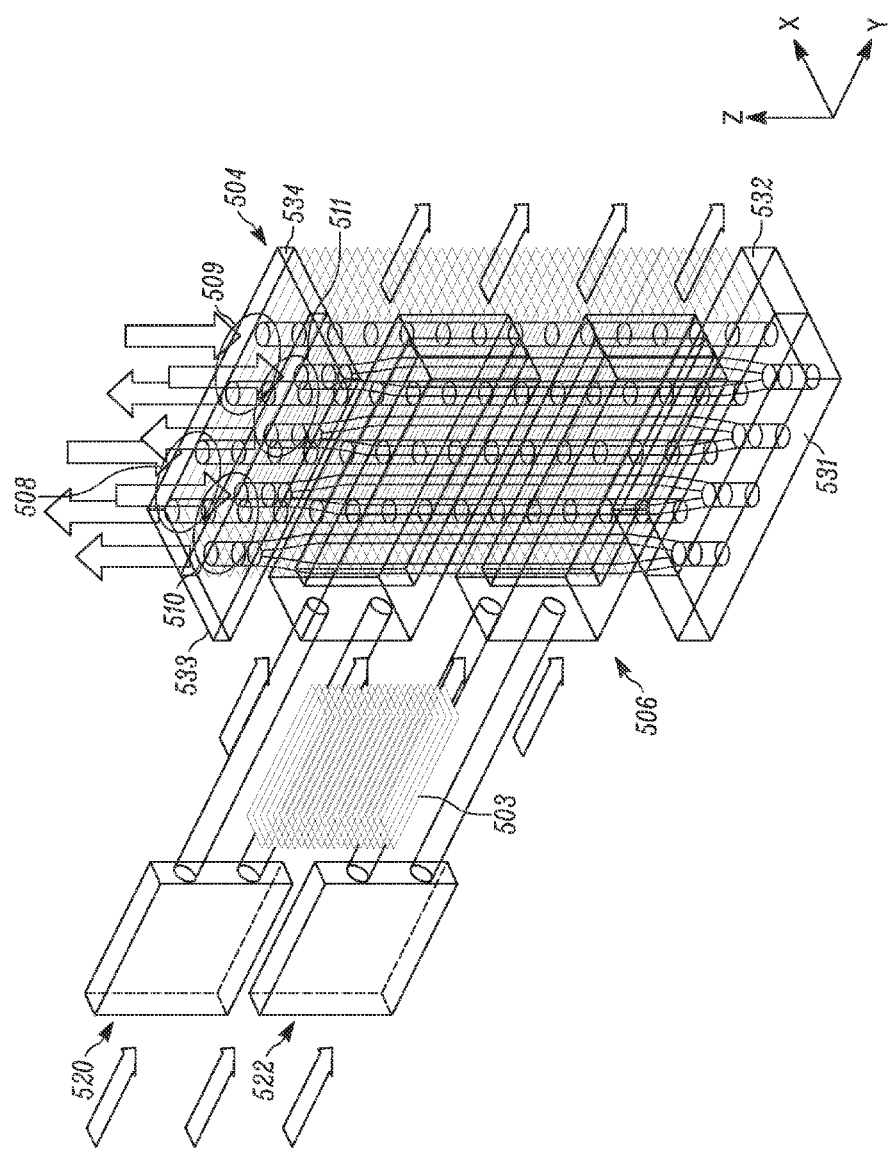
FIG. 5 is a detailed perspective view of an embodiment of one section of the bimodal cooling system in accordance with some embodiments.

FIG. 5 illustrates a perspective view of another example of the bimodal cooling structures within a backplane module in accordance with some embodiments. In the depicted view, an air-fluid heat exchange structure 504 and a direct contact heat exchange structure 506 of a backplane module are depicted from a rear perspective view. As also shown in FIG. 5, standard air-cooled cooling structures, such as a heat sink 503, may be used in a compute module to take advantage of the cooling airflow through the compute module for purposes of cooling lower power compute resources of the compute module. In the depicted example, the air-fluid heat exchange structure 504 comprises two sets 508 and 509 of pipe segments, with set 508 forming a corresponding section of one fluid circulation loop and the set 509 forming a corresponding section of a second fluid circulation loop. Similarly, the direct contact heat exchange structure 506 comprises two sets 510 and 511 of pipe segments, with the set 510 forming a corresponding section of a third fluid circulation loop and the set 511 forming a corresponding section of a fourth fluid circulation loop. Further, in this example, the compute module implements two cold plate structures 520 and 522 (e.g., one for a CPU and one for a GPU in the compute module), with each of the two cold plate structures having a thermal connector 138 that mechanically and thermally couples with the sets 510 and 511 of pipe segments. As shown in FIG. 5, the pipe segments of the sets 510 and 511 may comprise flattened or "squared" portions engaged on opposite sides by the prongs or louvers of the thermal connector 138 of a cold plate structure so as to permit greater contact area, and thus greater thermal coupling, between the pipe segments and the prongs/louvers.

In the depicted implementation, each backplane module includes joining couplers 531 and 532 and alignment couplers 533 and 534. The joining couplers 531 and 532 comprise a set of holes sized to the outer diameter of the pipe segments so as to receive the ends of the pipe segments of the backplane module at the lower level. The holes may have one or more O-rings positioned therein to provide sufficient sealing. The alignment couplers 533 and 534 comprise holes aligned and dimensioned so as to slip over the top ends of the pipe segments so that a portion of the top end of each pipe segment extends above the top surface of the alignment coupler so that the exposed top end of the pipe segment can be inserted into the corresponding hole in the corresponding joining coupler of the backplane module at the higher level.

Figure 6:
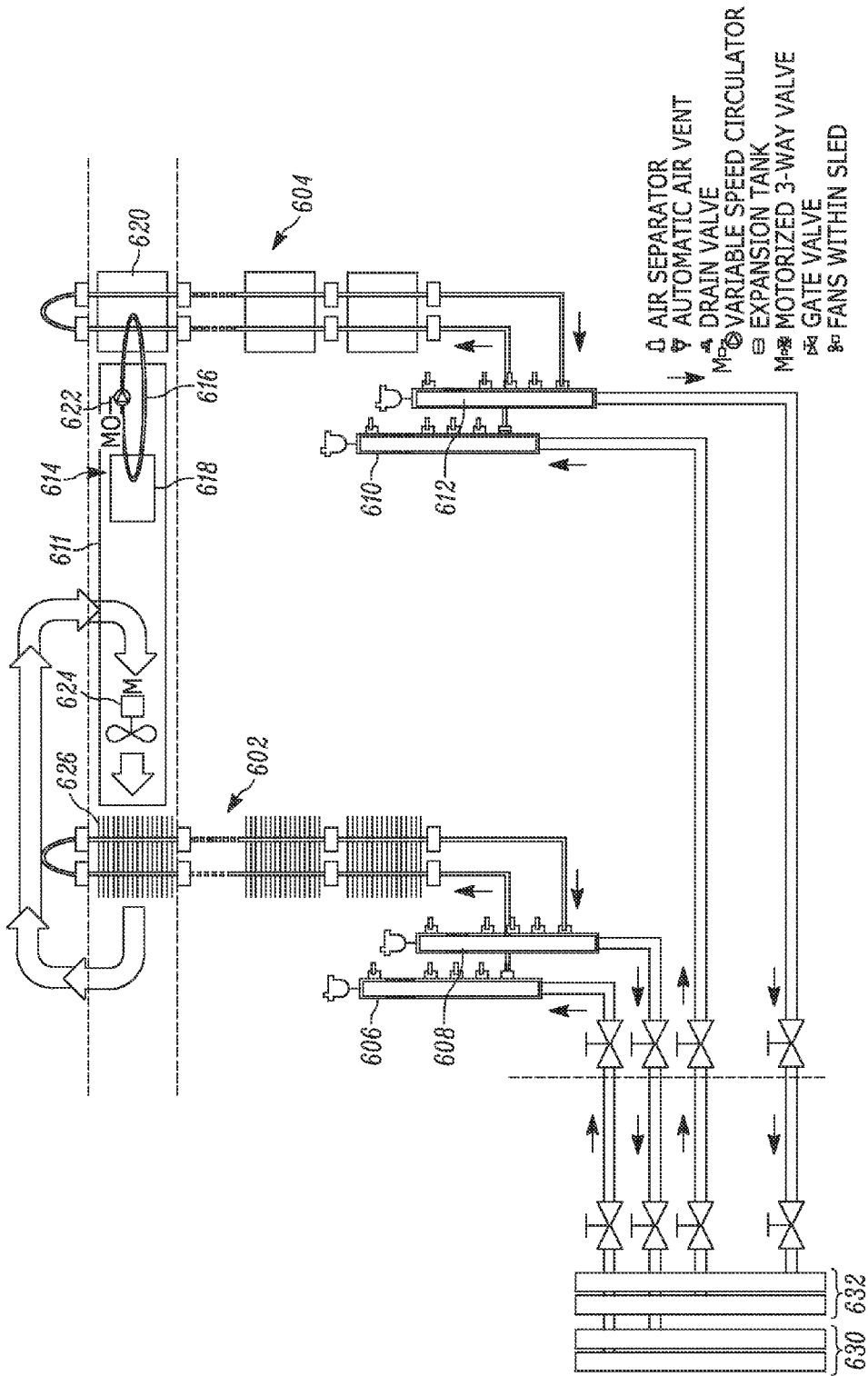
FIG. 6 is a diagram view illustrating a circulation configuration of a bimodal cooling system utilizing two main water loops in accordance with some embodiments.
Figure 7:
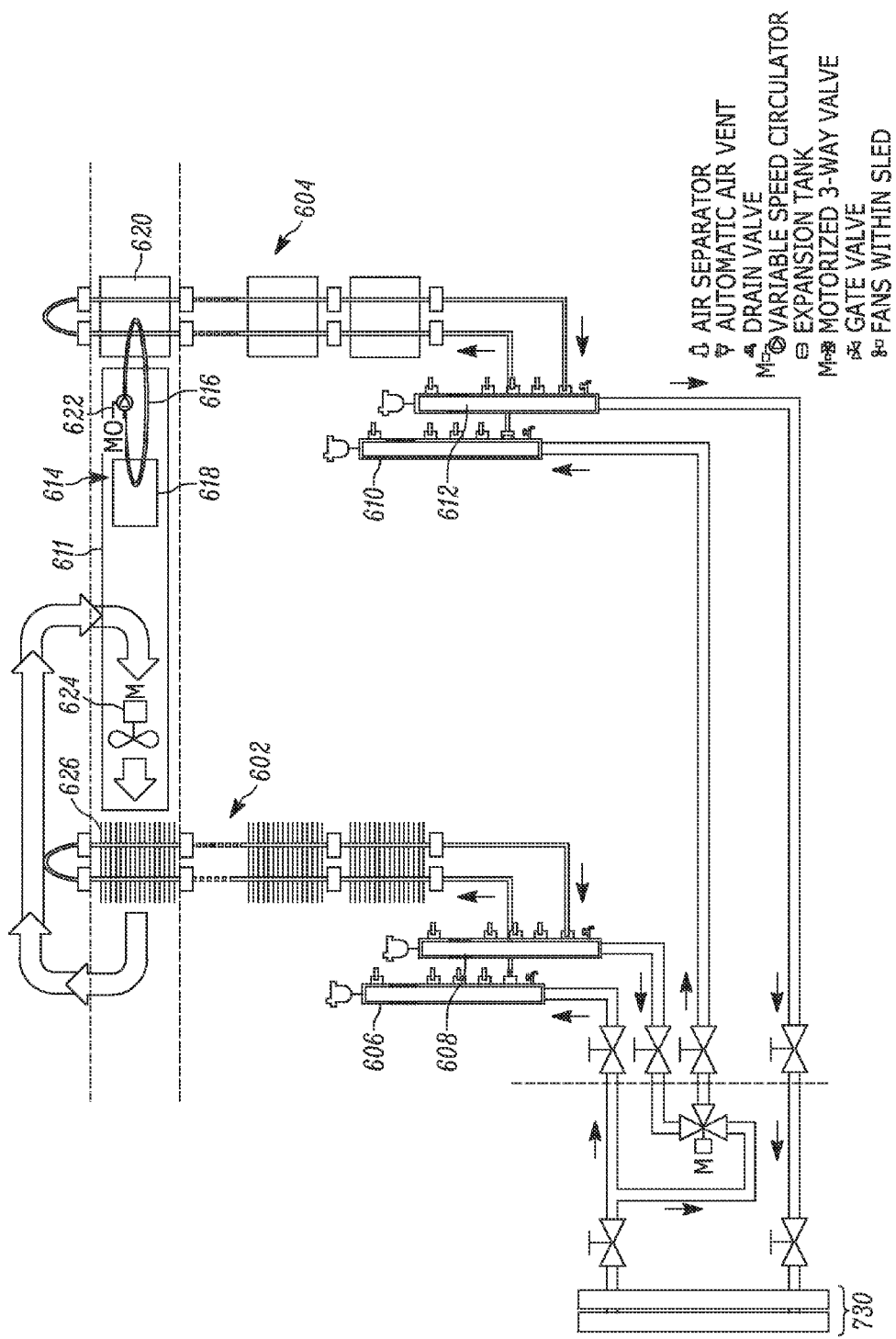
FIG. 7 is a diagram view illustrating a circulation configuration of a bimodal cooling system utilizing a single main water loop in accordance with some embodiments.
Figure 8:
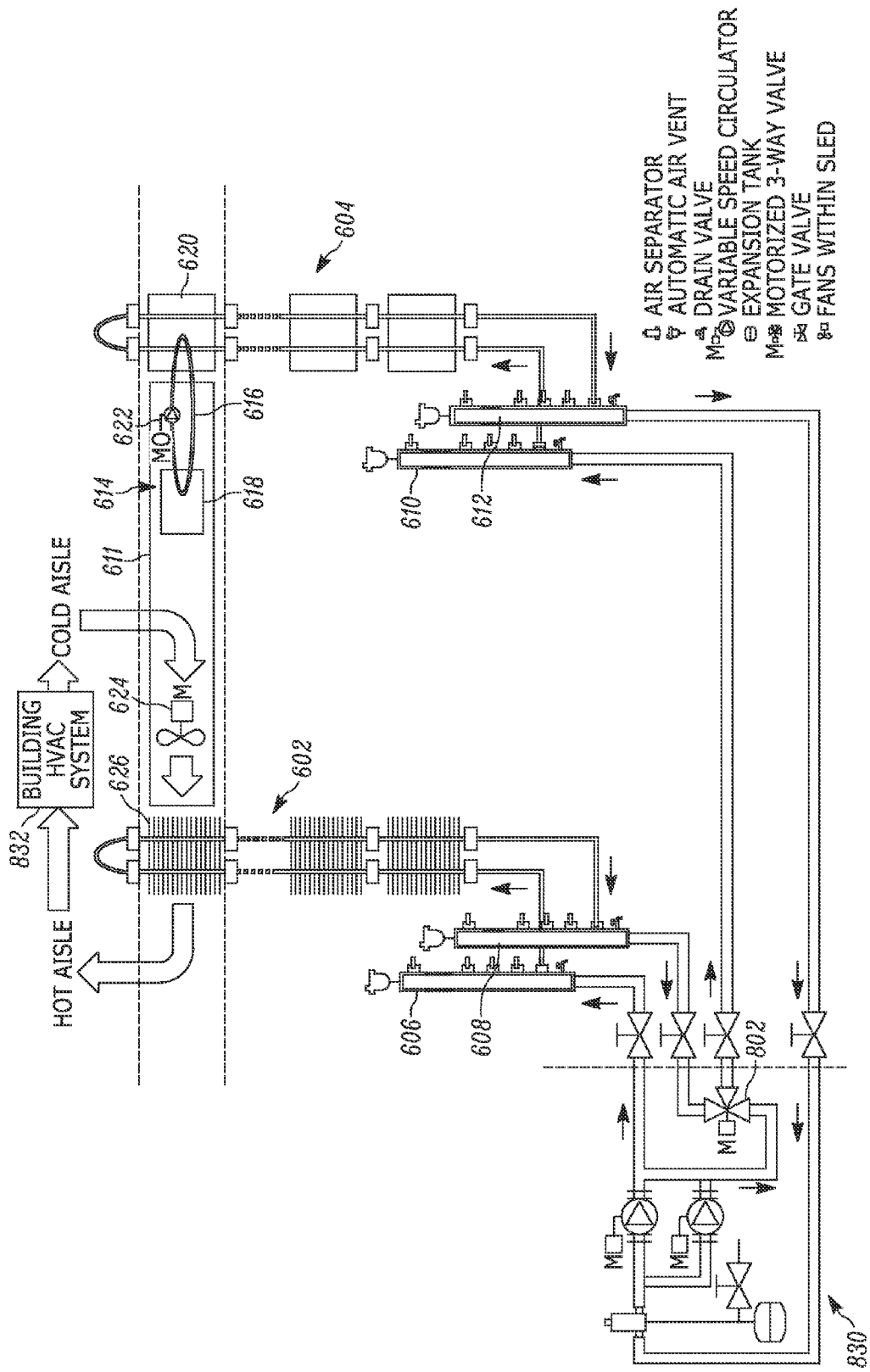
FIG. 8 is a diagram view illustrating a circulation configuration of a bimodal cooling system utilizing a closed water loop and HVAC-based water cooling in accordance with some embodiments.

As described above, the bimodal cooling system 130 of the modular server system 100 relies on fluid circulation loops for both the air-fluid heat exchange process and the direct contact heat exchange process for efficient evacuation of heat energy from the modular server system 100. FIGS. 6-8 depict schematic diagrams illustrating example fluid circulation systems for circulating cooling water (or other fluid) through the circulation loops of the bimodal cooling system 130. For FIGS. 6-8, the air-fluid heat exchange subassembly (e.g., air-fluid heat exchange subassembly 402 of FIG. 4) for a column is depicted in schematic form as an air-fluid cooling loop 602 and the direct contact heat exchange subassembly (e.g., direct contact heat exchange assembly 404 of FIG. 4) for the column is depicted in schematic form as a cold plate cooling loop 604. Further, as illustrated, the intakes of the air-fluid cooling loops 602 of the plurality of columns in the modular server system 100 are coupled together via a manifold 606 and the outlets of the air-fluid cooling loops 602 are coupled together via a manifold 608. Similarly, the intakes of the cold plate cooling loops 604 of the plurality of columns are coupled together via a manifold 610 and their outlets are coupled together via a manifold 610. The schematic diagrams of FIGS. 6-8 further illustrate the cooling operation of a compute module 611 (one example of compute module 111 of FIG. 1) in a particular slot of a particular column, with the other compute modules operating in a similar manner. A cold plate structure 614 (one example of cold plate structure 134 of FIG. 1) of the compute module 611 operates to circulate PCM 616 between a cold plate 618 overlying a CPU and a thermal connector 620 with the help of a variable-speed circulator 622. Likewise, one or more low-power fans 624 (one embodiment of fan 144 of FIG. 1) operate to circulate air through the compute module 611, over an air-fluid heat exchange structure 626 (one embodiment of the air-fluid heat exchange structure 132 of FIG. 1), and out a backside of the corresponding backplane module.

In the configuration of FIG. 6, both a main cold water loop 630 and a warm water loop 632 are available in the data center. Accordingly, water from the inlet side of the main warm water loop 630 is routed through one or more valves to the inlet of the manifold 606 for distribution to the intake sides of the air-fluid circulation loops 602 of the plurality of columns and the outlet of the manifold 608 is routed to the outlet side of the main cold water loop 630 for evacuation of the heated water from the air-fluid circulation loops 602 of the plurality of columns. Similarly, water from the inlet side of the main warm water loop 632 is routed through one or more valves to the inlet of the manifold 610 for distribution to the intake sides of the cold plate cooling loops 604 of the plurality of columns and the outlet of the manifold 612 is routed to the outlet side of the main warm water loop 632 for evacuation of the heated water from the outlets of the cold plate cooling loops 604 of the plurality of columns. The heated water from the outlet sides of the main cold water loop 630 and main warm water loop 632 then may be routed to the appropriate cooling systems to be cooled.

In the configuration of FIG. 7, only a single water loop 730 is available in the data center. Accordingly, in this configuration water from the inlet side of the water loop 730 is routed through one or more valves to the inlet of the manifold 606 for distribution to the intake sides of the air-fluid circulation loops 602 of the plurality of columns. Heated water from the outlets of the air-fluid circulation loops 602 is returned to the intakes of the manifold 608. The heated water from the outlet of the manifold 608 is combined via a three-way valve 702 with water from the inlet side of the water loop 730 and the resulting combined outlet water flow is routed to the intake of the manifold 610 for distribution to the intake sides of the cold plate cooling loops 604 of the plurality of columns and the outlet of the manifold 612 is routed to the outlet side of the water loop 730 for evacuation of the heated water from the outlets of the cold plate cooling loops 604 of the plurality of columns. The heated water from the outlet side of the water loop 730 then may be routed to the appropriate cooling systems to be cooled. As the water supplied to the inlets of the cold plate cooling loops 604 is a combination of the relatively cooler water from the intake side of the main water loop 730 and the relatively warmer water from the outlets of the air-fluid cooling loops 602, in some embodiments the three way valve 702 may be controlled to provide a desired proportion between these two inputs to achieve an appropriate rate of heat evacuation via the cold plate cooling loops 604.

In the configurations of FIGS. 6 and 7, water cooling systems are utilized to remove heat from the outlet side of the water loops, and thus with cooler water supplied to the air-fluid cooling loops 602 the heat evacuation capacity supplied by the air-fluid cooling loops 602 may be sufficient to remove most or all of the heat energy from the circulated air, thereby enabling the air evacuated from the back of the backplane modules to be at or near the intake air temperature, which in turn reduces the cooling burden placed on the computer room air conditioning (CRAC) unit to cool the expelled air back to a suitable intake temperature. However, in other embodiments, a water cooling system may not be available, or may not have a cooling capacity sufficient for use in the configurations depicted by FIGS. 6 and 7. FIG. 8 thus illustrates an example cooling circulation configuration whereby the CRAC unit or other HVAC capacity of the data center is used to cool the water circulated in the loops 602 and 604. Thus, in the example of FIG. 8, the data center provides only a closed water loop 830 without a separate water cooling system. In this implementation, heated water from the outlets of the cold plate cooling loops 604 is combined at the manifold 612 and then routed to the intake of the manifold 606. The manifold 606 distributes this heated water to the intakes of the air-fluid cooling loops 602, which run the heated water through the radiator structures of the series of air-fluid heat exchange structures 626 on each air-fluid cooling loop 602. In this configuration, the modular server system 100 is situated with its front side facing a "cold aisle" and its back side facing a "hot aisle" such that the fans 624 intake cool air from the cold aisle, the cool air flows over the radiator structures and removes heat energy from the water in the cooling loops 602, and the resulting heated air is expelled into the hot aisle to be cooled by an HVAC system 832 of the data center, with the cooled air returning to the cold aisle. The resulting cooled water returned from the outlets of the air-fluid cooling loops 602 to the manifold 608, from which the cooled water is combined in some proportion with the heated water of the closed water loop 830 via a three-way valve 802 and the resulting cooler water flow is routed to the input of the manifold 610, which in turn distributes the cooler water flow to the intakes of the cold plate cooling loops 604. Thus, in this configuration the HVAC system 832 and the air-fluid interface provided by the air-fluid loops 604 are used to supply the cooling capacity for the water of the closed water loop 830 in place of, or in addition to, a separate or dedicated water cooling unit.

The series connections of the air-fluid heat exchange structures 626 in the air-fluid cooling loops 602 and the series connections of the cold plate structures 614 in the cold plate cooling loops 604, as depicted in the configurations of FIGS. 6-8, have the effect of averaging or distributing the heat energy within a column. Thus, a compute module running at full capacity can take advantage of the underutilized cooling capacity of an idle compute module in the same column. System operators can take advantage of this effect by scheduling certain compute modules to operate at or over capacity when other compute modules in the same column are predicted to be idle, thereby allowing the cooling capacity of the idle compute modules to compensate for the excessive heat generation of the loaded compute modules.

Figure 9:
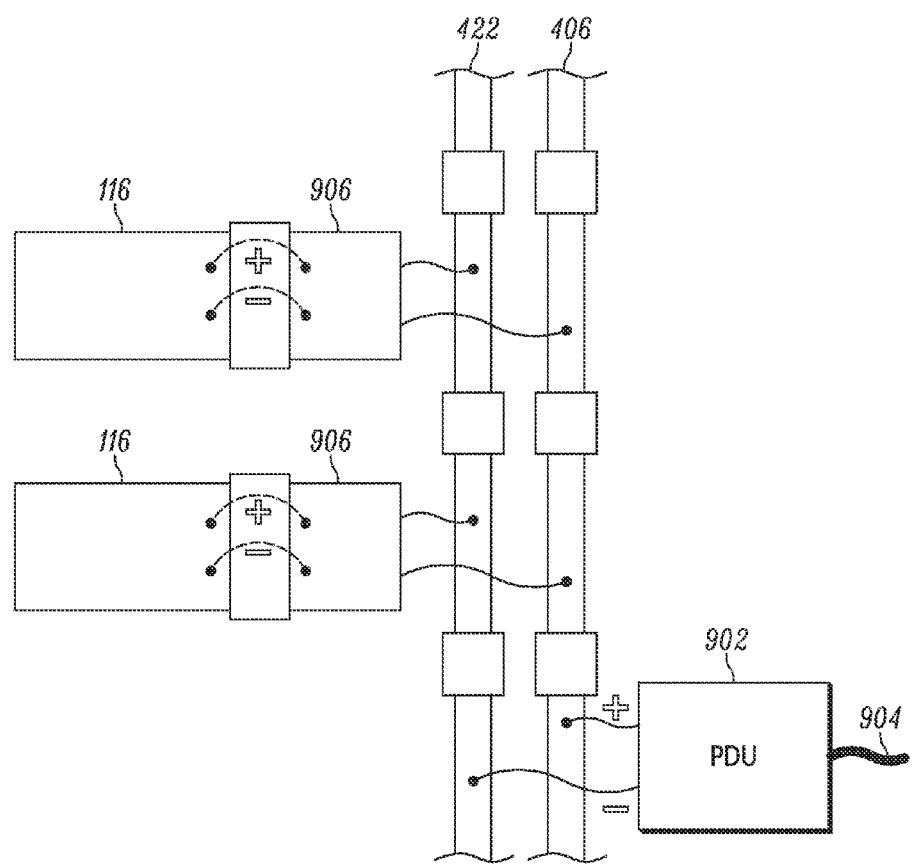
FIG. 9 is a diagram view illustrating a system for supply voltage distribution using the piping of a bimodal cooling system of a modular server system in accordance with some embodiments.

As the piping of the fluid circulation loops generally is constructed of copper, aluminum, or other conductive material, and as the piping runs the vertical extent of the stack of backplane modules, in at least one embodiment the modular server system 100 can utilize the piping to supply power to the modular compute structures 104-107. FIG. 9 illustrates an example system for providing this capability. As depicted in FIG. 9, the base 108 may employ a power distribution unit (PDU) 902 that receives power from main power supply of the data center, and from this input, generates one or more supply voltages (identified in FIG. 9 as "+" supply voltage and "−" supply voltage), which may be AC voltages or DC voltages. The PDU 902 includes outputs electrically coupled to the piping of one or more of the fluid circulation loops so as to energize the corresponding piping with a corresponding supply voltage. To illustrate, the base 108 may include couplers to receive the bottom ends of the sets of pipe segments of the bottom backplane module in the stack, and these couplers are connected via electrical cabling to outputs of the PDU 902. For example, the PDU 902 may energize the fluid circulation loop 406 (FIG. 4) of the air-fluid heat exchange subassembly 402 with a positive supply voltage and energize the fluid circulation loop 422 (FIG. 4) of the direct heat exchange subassembly 404 with a negative supply voltage. In such instances, care should be taken to ensure that electrically conductive contact is not avoided between the piping and other components of the two subassemblies 402 and 404. As another example implementation, with reference to the implementation of FIG. 5 the PDU 902 may energize a fluid circulation loop formed in part by the set 510 of pipe segments with a positive supply voltage and energize a fluid circulation loop formed in part by the set 511 of pipe segments with a negative supply voltage. In this implementation, the thermal connector 520 (FIG. 5) could conductively connect to the set 510 of pipe segments to receive the positive supply voltage for the compute module and the thermal connector 522 (FIG. 5) could conductively connect to the set 512 of pipe segments to receive the negative supply voltage for the compute module.

Each backplane assembly includes inputs electrically connected to the piping to receive the corresponding supply voltage. To illustrate, as depicted in the example of FIG. 9 the interface boards 906 of each backplane module include wiring or other conductive connections (e.g., via a shared bus bar) to the corresponding pipe segments of the fluid circulation loops 406 and 422. The interface board 906 thus may distribute the received supply voltages (or voltages derived therefrom) to the circuit boards 116 of the compute modules coupled to the interface boards 906.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:
1. A server system comprising:
   a plurality of modular computing structures stacked in a first orientation, each modular computing structure comprising:
      a circuit board comprising a computing resource;
      an air-fluid heat exchange structure comprising a first set of pipe segments; and a cold plate structure attached to a second set of pipe segments of the modular computing structure; and wherein the first set of pipe segments of each modular computing structure interfaces with the first set of pipe segments of at least one adjacent modular computing structure to form a corresponding section of a first fluid circulation loop; and wherein the second set of pipe segments of each modular computing structure interfaces with the second set of pipe segments of at least one adjacent modular computing structure to form a corresponding section of a second fluid circulation loop.

2. The server system of claim 1, wherein the cold plate structure of each modular computing structure comprises:
a cold plate adjacent to the computing resource of the modular computing structure;
a thermal connector thermally coupled to the second set of pipe segments of the modular computing structure; and
a set of circulation pipe segments coupling the cold plate and the thermal connector.

3. The server system of claim 2, further comprising:
a phase change material to circulate between the cold plate and the thermal connector via the set of circulation pipe segments.

4. The server system of claim 2, wherein the thermal connector is removably coupled to the second set of pipe segments.

5. The server system of claim 2, wherein:
the air-fluid exchange structure of each modular computing structure comprises a radiator structure attached to the first set of pipe segments of the modular computing structure; and
the thermal connector of the modular computing structure is proximate to the radiator structure of the modular computing structure.

6. The server system of claim 5, wherein:
the second set of pipe segments comprise flattened regions; and
the thermal connector comprises a set of prongs or louvers to engage with opposite sides of the pipe segments of the second set of pipe segments in the flattened regions.

7. The server system of claim 1, wherein each modular computing structure comprises:
a backplane module containing the first set of pipe segments, the second set of pipe segments, and the air-fluid heat exchange structure;
a compute module containing the circuit board and the cold plate structure; and
wherein the compute module is removably coupled with the backplane module in a second orientation perpendicular to the first orientation.

8. The server system of claim 7, wherein:
the backplane module comprises a ventilated back surface and an interface board perpendicular to the ventilated back surface, the interface board electrically coupled to a corresponding interface of the circuit board.

9. The server system of claim 8, wherein:
the compute module comprises a set of one or more fans oriented to draw air in a direction parallel with the circuit board and interface board.

10. The server system of claim 1, wherein an outlet of the first fluid circulation loop is coupled to an inlet of the second fluid circulation loop.

11. The server system of claim 1, wherein an outlet of the second fluid circulation loop is coupled to an inlet of the first fluid circulation loop.

12. The server system of claim 1, further comprising:
a power supply subsystem having an output coupled to a pipe segment of one of the first fluid circulation loop and the second fluid circulation loop, the output to provide a supply voltage; and
wherein the circuit board of each modular computing structure receives the supply voltage from the power supply subsystem via an electrical connection to a corresponding pipe segment.

13. A modular server system comprising:
a plurality of compute modules, each compute module comprising:
a circuit board comprising a computing resource; and
a cold plate structure comprising:
a cold plate thermally coupled to the computing resource;
a thermal connector; and
circulation piping connecting the cold plate and the thermal connector to facilitate flow of a phase change material between the cold plate and the thermal connector; and
a backplane module to couple with the plurality of compute modules, the backplane module comprising:
a ventilated back surface;
a plurality of interface boards oriented perpendicular to the ventilated back surface, each of the plurality of interface boards to electrically couple to the circuit board of a corresponding compute module;
a plurality of air-fluid heat exchange structures proximate to the ventilated back surface, each air-fluid heat exchange structures comprising a corresponding first set of pipe segments and a radiator structure attached to the first set of pipe segments, the first sets of pipe segments oriented in a first direction parallel with the ventilated back surface; and
a plurality of second sets of pipe segments oriented in the first direction, each second set of pipe segments thermally coupled with the thermal connector of a corresponding modular compute node.

14. The modular server system of claim 13, wherein each compute module further comprises:
at least one fan to draw air in a direction perpendicular to the ventilated back surface.

15. The modular server system of claim 13, wherein the plurality of compute modules are removably attached to the backplane module.

16. The modular server system of claim 15, wherein the thermal connector comprises a prong structure to removably engage opposite sides of pipe segments of a corresponding second set of pipe segments.

17. The modular server system of claim 13, wherein the backplane module further comprises at least one pipe segment to couple the first sets of pipe segments and the second sets of pipe segments to corresponding first sets of pipe segments and second sets of pipe segments of an adjacent backplane module.

18. The modular server system of claim 13, wherein the backplane module comprises at least one voltage input electrically connected to a pipe segment of one of the first set of pipe segments or the second set of pipe segments.

19. A server system comprising:
a backplane module comprising:
a ventilated back surface;
a plurality of interface boards oriented perpendicular to the ventilated back surface;
a plurality of air-fluid heat exchange structures adjacent to the ventilated back surface, each air-fluid heat exchange structure comprising:

a first set of pipe segments extending between opposing sides of the backplane module;

a set of first pipe couplers, each first pipe coupler disposed at an end of at least one pipe segment of the first set of pipe segments, wherein each of the first pipe couplers is configured to receive at least one pipe segment of a first set of pipe segments of another backplane module that is adjacent to the backplane module;

a radiator structure attached to the first set of pipe segments;

a plurality of second sets of pipe segments, each second set of pipe segments extending between opposing sides of the backplane module; and a set of second pipe couplers, each second pipe coupler disposed at an end of at least one pipe segment of the second set of pipe segments, wherein each of the second pipe couplers is configured to receive at least one pipe segment of a second set of pipe segments of the other backplane module.

20. The server system of claim 19, further comprising:

a plurality of circuit boards oriented perpendicular to the ventilated back surface and coupled to a corresponding interface board of the plurality of interface boards, each circuit board comprising a computing resource; and a plurality of cold plate structures, each cold plate structure comprising a cold plate adjacent to the computing resource of a corresponding circuit board, a thermal connector thermally coupled to a corresponding second set of pipe segments, and a phase change material to circulate between the cold plate and the thermal connector; and a plurality of fans to draw air over the cold plate structures and the air-fluid heat exchange structures.

* * * * *